(12) United States Patent
Paramanandam et al.

(10) Patent No.: US 12,238,854 B2
(45) Date of Patent: Feb. 25, 2025

(54) PRINTED CIRCUIT BOARD ASSEMBLY EMBEDDED THERMAL MANAGEMENT SYSTEM USING PHASE CHANGE MATERIALS

(71) Applicant: Honeywell International Inc., Charlotte, NC (US)

(72) Inventors: Karthikeyan Paramanandam, Bangalore (IN); Pedro Luis Lebron, San Antonio, PR (US)

(73) Assignee: Honeywell International Inc., Charlotte, NC (US)

( * ) Notice: Subject to any disclaimer, the term of this patent is extended or adjusted under 35 U.S.C. 154(b) by 175 days.

(21) Appl. No.: 18/049,565

(22) Filed: Oct. 25, 2022

(65) Prior Publication Data

US 2024/0080966 A1 Mar. 7, 2024

(30) Foreign Application Priority Data

Sep. 2, 2022 (IN) .............................. 202211050242

(51) Int. Cl.
*H05K 1/02* (2006.01)

(52) U.S. Cl.
CPC ......... *H05K 1/0212* (2013.01); *H05K 1/0298* (2013.01)

(58) Field of Classification Search
CPC .................... H05K 1/0212; H05K 1/0298
See application file for complete search history.

(56) References Cited

U.S. PATENT DOCUMENTS

| | | |
|---|---|---|
| 9,986,636 B2 | 5/2018 | Mahler et al. |
| 10,798,848 B2 | 10/2020 | Delano et al. |
| 10,939,537 B1 | 3/2021 | Lebron et al. |
| 10,999,921 B2 | 5/2021 | Park et al. |
| 11,049,794 B2 | 6/2021 | Arora et al. |
| 2022/0377873 A1* | 11/2022 | Wang ................... H05K 1/0306 |

FOREIGN PATENT DOCUMENTS

| | | |
|---|---|---|
| CN | 1272038 A | 11/2000 |
| CN | 107734840 A | 2/2018 |
| EP | 4012762 A1 | 6/2022 |

* cited by examiner

*Primary Examiner* — Jeremy C Norris
(74) *Attorney, Agent, or Firm* — Fogg & Powers LLC (57) ABSTRACT

An electronic assembly comprises a printed circuit board including a plurality of stacked layers, wherein the stacked layers comprise a plurality of conductive layers, a plurality of dielectric layers respectively interposed between the conductive layers, and one or more phase change material layers interposed between at least one pair of the dielectric layers or at least one pair of the conductive layers. During a phase change, the one or more phase change material layers are configured to absorb thermal energy at a phase transition temperature to provide enhanced cooling of the printed circuit board. In some embodiments, the printed circuit board can be a metal core printed circuit board.

20 Claims, 5 Drawing Sheets

PRINTED CIRCUIT BOARD ASSEMBLY EMBEDDED THERMAL MANAGEMENT SYSTEM USING PHASE CHANGE MATERIALS

CROSS-REFERENCE TO RELATED APPLICATION

This application claims priority to Indian Provisional Patent Application No. 202211050242, filed on Sep. 2, 2022, which is incorporated by reference herein in its entirety.

BACKGROUND

In general, electronics assemblies increasingly incorporate high power components as part of their architectures or electrical topology. As such, thermal performance becomes a concern with respect to overall system performance and product life. Depending on the heat flux and operating environments, a simple to a more complex thermal management system may be required. However, the implementation of advanced thermal management techniques (e.g., component heat sinks, thermo-electric cooler, liquid cooling, etc.) can negatively impact product size, weight and cost. In addition, depending on the thermal management system implemented, product reliability may become a concern due to introduction of additional points of failure.

SUMMARY

An electronic assembly comprises a printed circuit board including a plurality of stacked layers, wherein the stacked layers comprise a plurality of conductive layers, a plurality of dielectric layers respectively interposed between the conductive layers, and one or more phase change material layers interposed between at least one pair of the dielectric layers or at least one pair of the conductive layers. During a phase change, the one or more phase change material layers are configured to absorb thermal energy at a phase transition temperature to provide enhanced cooling of the printed circuit board. In some embodiments, the printed circuit board can be a metal core printed circuit board.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

Various embodiments of a printed circuit board assembly, with an embedded thermal management system using phase change materials, are described herein.

In the present approach, one or more phase change material layers are embedded within a stack-up of a printed circuit board (PCB) or circuit card. This enables the management of high thermal loads while minimizing the overall size, weight, and part count impact to a product using the PCB. The present approach can be used for any applications where PCBs are involved.

A phase change material (PCM) is a substance that absorbs sufficient energy at a phase transition to provide useful cooling. Generally, the phase transition will be from one of the two states of matter—solid and liquid—to the other. In the present approach, a PCM layer(s) helps to remove heat from an electronic component coupled to the PCB by latent heat. During a phase change, the PCM layer absorbs more heat without increasing its temperature. This process continues until the PCM layer has changed its phase (e.g., converted from a solid into a liquid). Since more heat is pumped out at a constant temperature, the present approach allows for adequate thermal management of high-power components while avoiding complex thermal management systems.

The PCB assembly with the PCM layer(s) provide a passive heat sink, which does not contain any moving parts, and does not require additional electronic circuitry or components for thermal management. For electronic components that are transient in operation and with high power dissipation, such as insulated gate bipolar transistors (IGBTs), the present approach helps to avoid larger heat sinks.

In various embodiments, the PCM layer may be located between a pair of dielectric layers of the PCB stack, or the PCM layer may be located between a pair of conductive layers of the PCB stack to provide for better heat transfer. In some embodiments, an electronic device electrically coupled to the printed circuit board can be in direct contact with a portion of the PCM layer.

In alternative embodiments, a metal core PCB (MCPCB) can be designed and made using a phase change material that constitutes one or more layers of the MCPCB. Typically, the metal core can be made of aluminum or copper alloy base materials. The purpose of the metal core of the MCPCB is to redirect heat away from board components. The base metals in the MCPCB are typically used as an alternative to FR4 or CEM3 boards.

As PCBs are used on all electronic assemblies, thermal management is always a concern due to increase in heat flux from the electronic components. The present approach helps to manage thermal loads on a PCB or circuit card efficiently, without using complex thermal management techniques. The size, weight, and cost of the PCB assembly will be reduced compared to other more complex thermal management techniques. In addition, the reliability of the PCB assembly will be increased as there are no moving parts.

In making a PCB according to the present approach, the thermal management needs for a particular application are identified by analysis or by other methods, and a phase change material is selected based on the temperature requirements. A PCB stack up is designed such that the phase change material constitutes one or more layers of the PCB. The phase change material layer design is such as to allow proper electrical functionality and thermal performance of the PCB. The PCB is also sealed on all sides so that the phase change material does not overflow or come out of the PCB during a phase change.

Further details related to the present embodiments are described as follows and with reference to the drawings.

Figure 1:
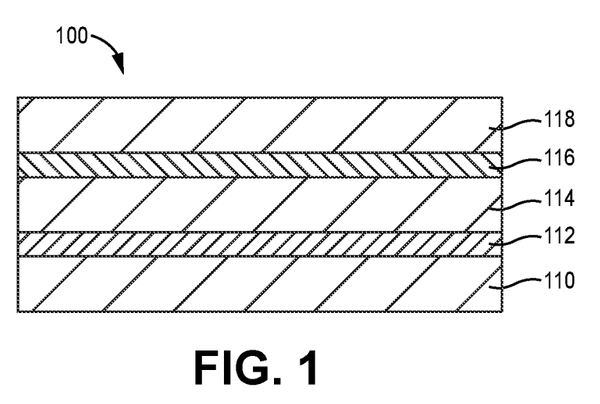
FIG. 1 is a cross-sectional schematic view of a printed circuit board (PCB), with an embedded phase change material layer, according to one embodiment.

FIG. 1 illustrates a stack configuration for a printed circuit board (PCB) 100, according to one embodiment. The stack configuration includes a first dielectric layer 110, a phase change material layer 112 over first dielectric layer 110, and a second dielectric layer 114 over phase change material layer 112. In addition, a conductive layer 116 is over second dielectric layer 114, and a third dielectric layer 118 is over conductive layer 116.

For example, conductive layer 116 can be interposed between a first pair of the dielectric layers that include dielectric layer 114 and dielectric layer 118, and phase change material layer 112 can be interposed between a second pair of the dielectric layers that include dielectric layer 110 and dielectric layer 114. In other embodiments, one or more additional dielectric layers, conductive layers, or phase change material layers can be added to the PCB stack. Examples of such other embodiments are described hereafter.

The dielectric layers 110, 114, 118 can be composed of various dielectric materials that are commonly used in the fabrication of printed circuit boards The conductive layer 116 is composed of a metal such as copper, for example.

The phase change material layer is configured to absorb thermal energy at a phase transition temperature to provide enhanced cooling of PCB 100. The phase change material layer can include one or more phase change material compositions such as paraffin waxes, dimethyl terephthalate, D-mannitol, adipic acid, potassium thiocyanate, hydroquinone, or benzanilide. Additional useful phase change materials are disclosed in U.S. Pat. No. 11,049,794, the disclosure of which is incorporated by reference herein.

The phase change material layer can be formed of varying thicknesses, depending on the heat removal requirements for use of the PCB. For example, if more heat needs to be removed, then more phase change material (of a greater thickness) can be used. In addition, a melting point or melting temperature range can be set via the phase change material, so that thermal energy is efficiently absorbed, in particular in an application-specific manner. As the operating temperature of the electronic components on the PCB can range from about 75° C. to about 200° C., the type of phase change material can be selected based on the electronic component operating temperature, ambient temperature, and power dissipation.

In order to prevent the phase change material from escaping PCB 100, phase change material layer 112 is sealed around its edges in a fluid-tight manner, such as with an adhesive or a polymer. This prevents the phase change material from escaping, in particular from outgassing of volatile components, so that the thermal capacity is maintained over an extended period of time. Alternatively, to prevent the phase change material from escaping, the phase change material can be embedded in a matrix material. For example, an adhesive or a polymer, in particular an epoxy material or silicone, can be used as the matrix.

The various layers in the stack configuration of PCB 100 can be formed using standard manufacturing techniques, including various deposition processes such as electron beam or ion beam deposition processes, physical or chemical vapor deposition processes, or the like.

During use of PCB 100, phase change material layer 112 provides additional cooling to PCB 100 due to latent heat. During a phase change, the phase change material layer 112 absorbs energy at the phase transition to provide the additional cooling.

Figure 2:
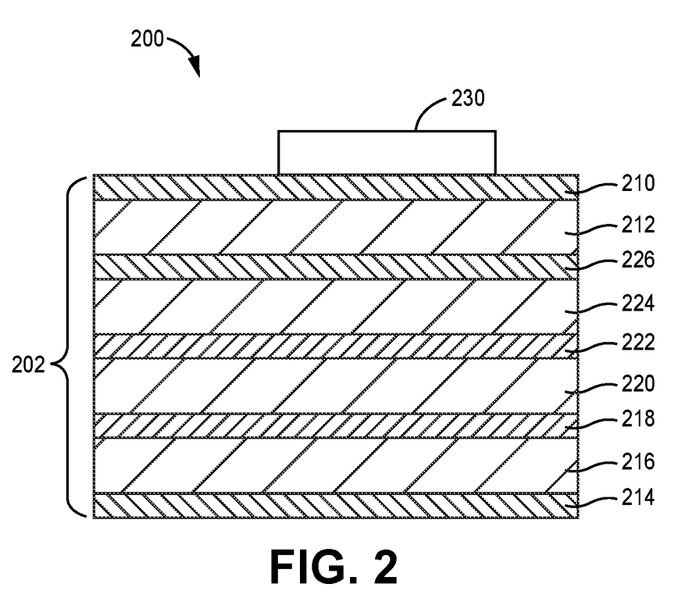
FIG. 2 is a cross-sectional schematic view of an electronic assembly, which includes a PCB with embedded phase change material layers, according to another embodiment.

FIG. 2 illustrates an electronic assembly 200, including a stack configuration for a PCB 202, according to another embodiment. The PCB 202 includes a top conductive layer 210 over a first dielectric layer 212, and a bottom conductive layer 214 under a second dielectric layer 216. A first phase change material layer 218 is over second dielectric layer 216, and a third dielectric layer 220 is over first phase change material layer 218. In addition, a second phase change material layer 222 is over third dielectric layer 220, and a fourth dielectric layer 224 is over second phase change material layer 222. Further, an intermediate conductive layer 226 is between fourth dielectric layer 224 and first dielectric layer 212.

At least one electronic device 230, such as a sensor or other circuit element, is electrically coupled to PCB 202 using standard connection techniques, such that electronic device 230 is in contact with top conductive layer 210. The phase change material layers 218, 222 are configured to absorb thermal energy at a phase transition temperature to provide enhanced cooling of PCB 202 during operation of electronic device 230.

The phase change material layers 218, 222 can be formed with any of the various phase change material compositions described above for PCB 100. The phase change material layers 218, 222 can be formed of varying thicknesses, depending on the heat removal requirements for electronic device 230. In addition, a melting point or melting temperature range can be set via the phase change material, so that thermal energy is efficiently absorbed during operation of electronic device 230.

In order to prevent the phase change material from escaping PCB 202, phase change material layers 218, 222 can be sealed around their edges in a fluid-tight manner. The various layers in the stack configuration of PCB 202 can be formed using standard manufacturing techniques, including various deposition processes such as described above.

During use of PCB 202, phase change material layers 218, 222 provide additional cooling to PCB 202 due to latent heat. During a phase change, phase change material layers 218, 222 absorb energy at the phase transition to provide the additional cooling.

Figure 3:
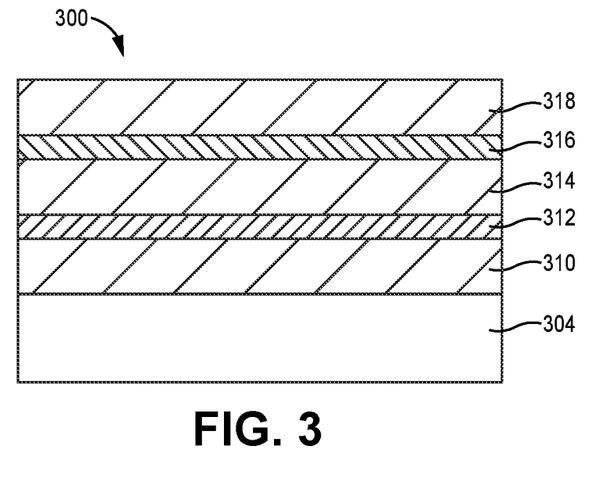
FIG. 3 is a cross-sectional schematic view of a metal core PCB (MCPCB), with an embedded phase change material layer, according to an alternative embodiment.

FIG. 3 illustrates a stack configuration for a metal core printed circuit board (MCPCB) 300, according to an alternative embodiment. The MCPCB 300 includes a metal core base 304, which can be formed of aluminum, copper, or alloys thereof, for example. A first dielectric layer 310 is over metal core base 304, a phase change material layer 312 is over first dielectric layer 310, and a second dielectric layer 314 is over phase change material layer 312. In addition, a conductive layer 316 is over second dielectric layer 314, and a third dielectric layer 318 is over conductive layer 316.

For example, conductive layer 316 can be interposed between a first pair of the dielectric layers that include dielectric layer 314 and dielectric layer 318, and phase change material layer 312 can be interposed between a second pair of the dielectric layers that include dielectric layer 310 and dielectric layer 314. In other embodiments, one or more additional dielectric layers, conductive layers, or phase change material layers can be added to the MCPCB stack.

The phase change material layer 312 can be formed with any of the various phase change material compositions described above for PCB 100. The phase change material layer 312 can be formed of varying thicknesses, depending on the heat removal requirements for use of MCPCB 300. In addition, a melting point or melting temperature range can be set via the phase change material, so that thermal energy is efficiently absorbed.

In order to prevent the phase change material from escaping MCPCB 300, phase change material layer 312 can be sealed around its edges in a fluid-tight manner. The various layers in the stack configuration of MCPCB 300 can be formed using standard manufacturing techniques, including various deposition processes such as described above.

During use of MCPCB 300, phase change material layer 312 provides additional cooling to MCPCB 300 due to latent heat. During a phase change, the phase change material layer 312 absorbs energy at the phase transition to provide the additional cooling.

Figure 4:
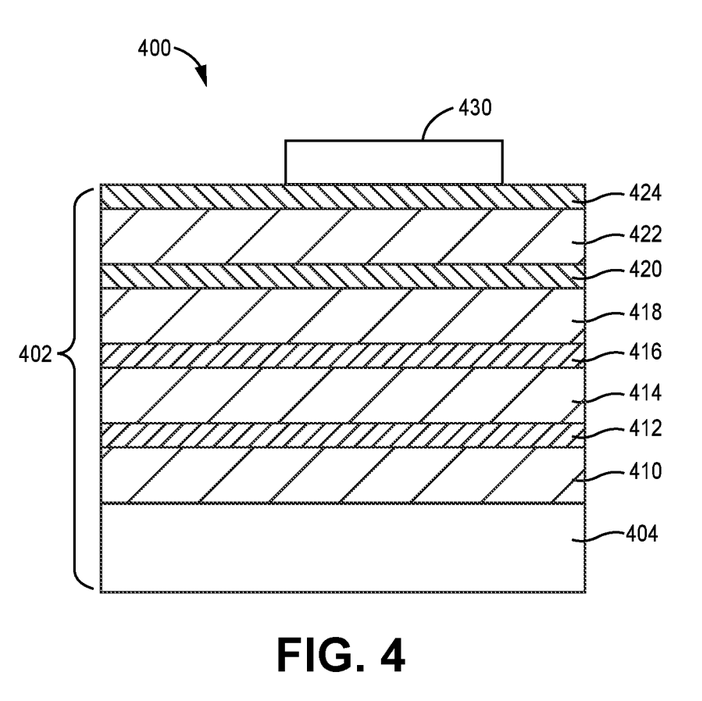
FIG. 4 is a cross-sectional schematic view of an electronic assembly, which includes a MCPCB with embedded phase change material layers, according to another alternative embodiment.

FIG. 4 illustrates an electronic assembly 400, including a stack configuration of a MCPCB 402, according to another alternative embodiment. The MCPCB 402 includes a metal core base 404, which can be formed of aluminum or copper materials, or alloys thereof, for example. A first dielectric layer 410 is over metal core base 404, a phase change material layer 412 is over first dielectric layer 410, and a second dielectric layer 414 is over phase change material layer 412. In addition, a second phase change material layer 416 is over second dielectric layer 414, and a third dielectric layer 418 is over second phase change material layer 416. Further, an intermediate conductive layer 420 is over third dielectric layer 418, a fourth dielectric layer 422 is over intermediate conductive layer 420, and an outer conductive layer 424 is over fourth dielectric layer 422.

At least one electronic device 430, such as a sensor or other circuit element, is electrically coupled to MCPCB 402 using standard connection techniques, such that electronic device 430 is in contact with outer conductive layer 424. The phase change material layers 412, 416 are configured to absorb thermal energy at a phase transition temperature to provide enhanced cooling of MCPCB 402 during operation of electronic device 430.

The phase change material layers 412, 416 can be formed with any of the various phase change material compositions described above for PCB 100. The phase change material layers 412, 416 can be formed of varying thicknesses, depending on the heat removal requirements for electronic device 430. In addition, a melting point or melting temperature range can be set via the phase change material, so that thermal energy is efficiently absorbed during operation of electronic device 430.

In order to prevent the phase change material from escaping MCPCB 402, phase change material layers 412, 416 can be sealed around their edges in a fluid-tight manner. The various layers in the stack configuration of MCPCB 402 can be formed using standard manufacturing techniques, including various deposition processes such as described above.

During use of MCPCB 402, phase change material layers 412, 416 provide additional cooling to MCPCB 402 due to latent heat. During a phase change, the phase change material layers 412, 416 absorb energy at the phase transition to provide the additional cooling.

Figure 5:
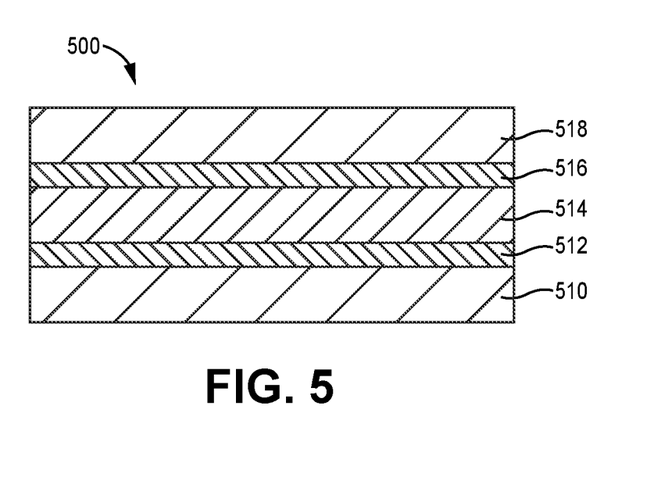
FIG. 5 is a cross-sectional schematic view of a PCB, with an embedded phase change material layer, according to a further embodiment.

FIG. 5 illustrates a stack configuration of a PCB 500, according to another embodiment. The PCB 500 includes a first dielectric layer 510, a first conductive layer 512 over first dielectric layer 510, a phase change material layer 514 over first conductive layer 512, a second conductive layer 516 over phase change material layer 514, and a second dielectric layer 518 over second conductive layer 516.

For example, the pair of conductive layers 512 and 516 can be interposed between dielectric layers 510 and 518, and phase change material layer 514 can be interposed between the pair of the conductive layers 512 and 516. In other embodiments, one or more additional dielectric layers, conductive layers, or phase change material layers can be added to the PCB stack.

The phase change material layer 514 can include the various phase change material compositions described above for PCB 100. The phase change material layer 514 can be formed of varying thicknesses, depending on the heat removal requirements for use of PCB 500. In addition, a melting point or melting temperature range can be set via the phase change material, so that thermal energy is efficiently absorbed.

In order to prevent the phase change material from escaping PCB 500, phase change material layer 514 can be sealed around its edges in a fluid-tight manner. The various layers in the stack configuration of PCB 500 can be formed using standard manufacturing techniques, including various deposition processes such as described above.

During use of PCB 500, phase change material layer 514 provides additional cooling to PCB 500 due to latent heat. During a phase change, the phase change material layer 514 absorbs energy at the phase transition to provide the additional cooling.

Figure 6:
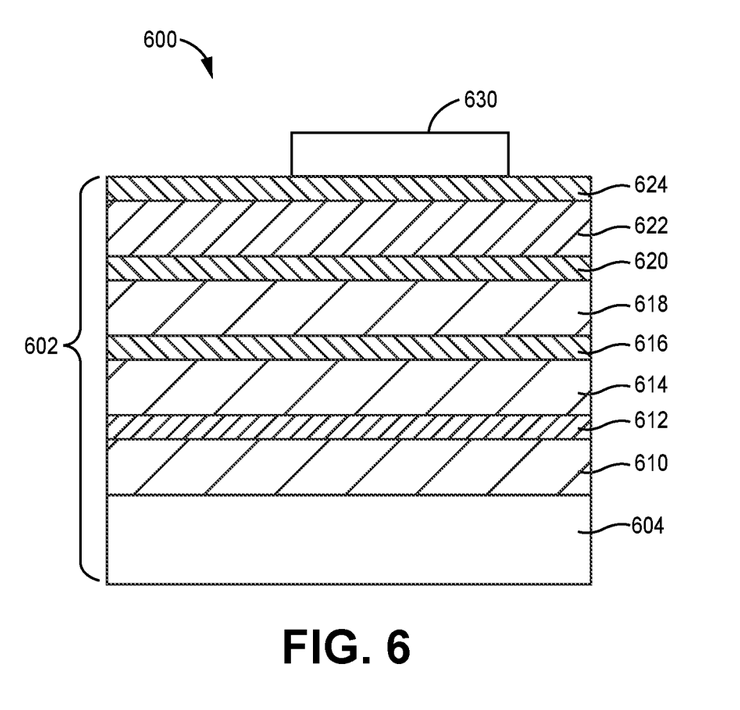
FIG. 6 is a cross-sectional schematic view of an electronic assembly, which includes a MCPCB with embedded phase change material layers, according to a further alternative embodiment.

FIG. 6 illustrates an electronic assembly 600, including a stack configuration of a MCPCB 602, according to another alternative embodiment. The MCPCB 602 includes a metal core base 604, which can be formed of aluminum or copper materials, or alloys thereof, for example. A first dielectric layer 610 is over metal core base 604, a first phase change material layer 612 is over first dielectric layer 610, and a second dielectric layer 614 is over first phase change material layer 612. In addition, a first conductive layer 616 is over second dielectric layer 614, and a third dielectric layer 618 is over first conductive layer 616. Further, a second conductive layer 620 is over third dielectric layer 618, a second phase change material layer 622 is over second conductive layer 620, and a third conductive layer 624 is over second phase change material layer 622.

At least one electronic device 630, such as a sensor or other circuit element, is electrically coupled to MCPCB 602 using standard connection techniques, such that electronic device 630 is in contact with third conductive layer 624. The phase change material layers 612, 622 are configured to absorb thermal energy at a phase transition temperature to provide enhanced cooling of MCPCB 602 during operation of electronic device 630.

The phase change material layers 612, 622 can be formed of any of the various phase change material compositions described above for PCB 100. The phase change material layers 612, 622 can be formed of varying thicknesses, depending on the heat removal requirements for electronic device 630. In addition, a melting point or melting temperature range can be set via the phase change material, so that thermal energy is efficiently absorbed during operation of electronic device 630.

In order to prevent the phase change material from escaping MCPCB 602, phase change material layers 612, 622 can be sealed around their edges in a fluid-tight manner. The various layers in the stack configuration of MCPCB 602 can be formed using standard manufacturing techniques, including various deposition processes such as described previously.

During use of MCPCB 602, phase change material layers 612, 622 provide additional cooling to MCPCB 602 due to latent heat. During a phase change, the phase change material layers 612, 622 absorb energy at the phase transition to provide the additional cooling.

Figure 7:
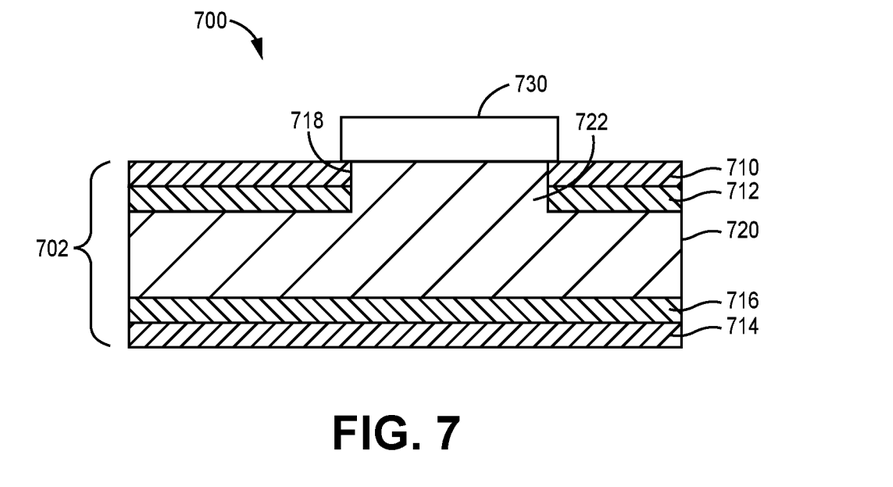
FIG. 7 is a cross-sectional schematic view of a PCB, with an embedded phase change material layer, according to another alternative embodiment.

FIG. 7 illustrates an electronic assembly 700, including a stack configuration of a PCB 702, according to a further alternative embodiment. The PCB 702 includes a top conductive layer 710 over a first dielectric layer 712, and a bottom conductive layer 714 under a second dielectric layer 716. A phase change material layer 720 is interposed between first dielectric layer 712 and second dielectric layer 716. At least one cavity 718 is formed in conductive layer 710 and dielectric layer 712 such that a portion 722 of phase change material layer 720 is held in cavity 718.

In addition, at least one electronic device 730, such as a sensor or other circuit element, is electrically coupled to PCB 702, such that electronic device 730 is in contact with conductive layer 710 and also is directly in contact with portion 722 of phase change material layer 720. The phase change material layer 720 is configured to absorb thermal energy at a phase transition temperature to provide enhanced cooling of PCB 702 during operation of electronic device 730. In other embodiments, multiple electronic components can be connected to phase change material layer 720 through multiple cavities in PCB 702.

The phase change material layer 720 can include the various phase change material compositions described above for PCB 100. The phase change material layer 720 can be formed of varying thicknesses, depending on the heat removal requirements for electronic device 730. In addition, a melting point or melting temperature range can be set via the phase change material, so that thermal energy is efficiently absorbed during operation of electronic device 730.

In order to prevent the phase change material from escaping PCB 702, phase change material layer 720 can be sealed around its edges in a fluid-tight manner. The various layers in the stack configuration of PCB 702 can be formed using standard manufacturing techniques, including various deposition processes such as described above.

During use of PCB 702, phase change material layer 720 provides additional cooling to PCB 702 due to latent heat. During a phase change, the phase change material layer 720 absorbs energy at the phase transition to provide the additional cooling.

In other alterative embodiments, one or more additional dielectric layers, conductive layers, or phase change material layers can be added to the PCB stack of electronic assembly 700. For example, phase change material layer 720 can be interposed between two conductive layers.

In further alterative embodiments, electronic assembly 700 can include a stack configuration in which the printed circuit board comprises a metal core printed circuit board. For example, a metal core base can be formed under conductive layer 714 and dielectric layer 716 to form a MCPCB.

Figure 8:
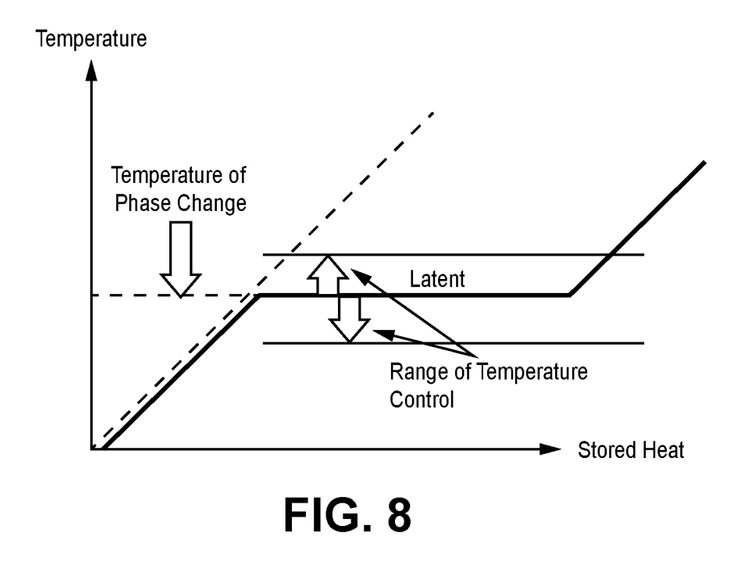
FIG. 8 is a graphical representation of stored heat with respect to temperature, when using a phase change material in a PCB or a MCPCB.

FIG. 8 is a graphical representation of stored heat with respect to temperature, when using a phase change material in a PCB or a MCPCB. FIG. 8 shows that at a temperature of the phase change, latent heat is produced that provides for a range of temperature control during the phase change.

EXAMPLE EMBODIMENTS

Example 1 includes an electronic assembly, comprising: a printed circuit board including a plurality of stacked layers, wherein the stacked layers comprise: a plurality of conductive layers; a plurality of dielectric layers respectively interposed between the conductive layers; and one or more phase change material layers interposed between at least one pair of the dielectric layers or at least one pair of the conductive layers; wherein during a phase change, the one or more phase change material layers are configured to absorb thermal energy at a phase transition temperature to provide enhanced cooling of the printed circuit board.

Example 2 includes the electronic assembly of Example 1, wherein the stacked layers of the printed circuit board comprise: a first dielectric layer; a phase change material layer under the first dielectric layer; and a second dielectric layer under the phase change material layer.

Example 3 includes the electronic assembly of Example 2, wherein the stacked layers of the printed circuit board comprise: a first conductive layer; a phase change material layer under the first conductive layer; and a second conductive layer under the phase change material layer.

Example 4 includes the electronic assembly of any of Examples 1-3, wherein the one or more phase change material layers comprise a paraffin wax, dimethyl terephthalate, D-mannitol, adipic acid, potassium thiocyanate, hydroquinone, or benzanilide.

Example 5 includes the electronic assembly of any of Examples 1-4, wherein the one or more phase change material layers have edges that are sealed in a fluid-tight manner.

Example 6 includes the electronic assembly of any of Examples 1-5, further comprising at least one electronic device electrically coupled to the printed circuit board.

Example 7 includes an electronic assembly, comprising: a metal core printed circuit board including a plurality of stacked layers, wherein the stacked layers comprise: a metal core base layer; a plurality of dielectric layers over the metal core base layer; a plurality of conductive layers respectively interposed between the dielectric layers; and one or more phase change material layers interposed between at least one pair of the dielectric layers or at least one pair of the conductive layers; wherein during a phase change, the phase change material layer is configured to absorb thermal energy at a phase transition temperature to provide enhanced cooling of the metal core printed circuit board.

Example 8 includes the electronic assembly of Example 7, wherein the stacked layers of the metal core printed circuit board comprise: a first dielectric layer; a phase change material layer under the first dielectric layer; and a second dielectric layer under the phase change material layer.

Example 9 includes the electronic assembly of Example 8, wherein the stacked layers of the metal core printed circuit board comprise: a first conductive layer; a phase change material layer under the first conductive layer; and a second conductive layer under the phase change material layer.

Example 10 includes the electronic assembly of any of Examples 7-9, wherein the metal core base comprises aluminum, copper, or alloys thereof.

Example 11 includes the electronic assembly of any of Examples 7-10, wherein the one or more phase change material layers comprise a paraffin wax, dimethyl terephthalate, D-mannitol, adipic acid, potassium thiocyanate, hydroquinone, or benzanilide.

Example 12 includes the electronic assembly of any of Examples 7-11, wherein the one or more phase change material layers have edges that are sealed in a fluid-tight manner.

Example 13 includes the electronic assembly of any of Examples 7-12, further comprising at least one electronic device electrically coupled to the printed circuit board.

Example 14 includes an electronic assembly, comprising: a printed circuit board including a plurality of stacked layers, wherein the stacked layers comprise: a plurality of conductive layers; a plurality of dielectric layers interposed between the conductive layers; and a phase change material layer interposed between at least one pair of the dielectric layers or at least one pair of the conductive layers; wherein at least one cavity is defined by at least one of the conductive layers and at least one of the dielectric layers such that a portion of the phase change material layer is held in the at least one cavity; at least one electronic device electrically coupled to the printed circuit board, such that the electronic device is in contact with at least one of the conductive layers and also in contact with the portion of the phase change material layer in the at least one cavity; wherein during a phase change, the phase change material layer is configured to absorb thermal energy at a phase transition temperature to provide enhanced cooling of the printed circuit board.

Example 15 includes the electronic assembly of Example 14, wherein the stacked layers of the printed circuit board comprise: a first dielectric layer; the phase change material layer under the first dielectric layer; and a second dielectric layer under the phase change material layer.

Example 16 includes the electronic assembly of Example 14, wherein the stacked layers of the printed circuit board comprise: a first conductive layer; the phase change material layer under the first conductive layer; and a second conductive layer under the phase change material layer.

Example 17 includes the electronic assembly of any of Examples 14-16, wherein the phase change material layer comprises a paraffin wax, dimethyl terephthalate, D-mannitol, adipic acid, potassium thiocyanate, hydroquinone, or benzanilide.

Example 18 includes the electronic assembly of any of Examples 14-17, wherein the phase change material layer has edges that are sealed in a fluid-tight manner.

Example 19 includes the electronic assembly of any of Examples 14-18, wherein the printed circuit board comprises a metal core printed circuit board.

From the foregoing, it will be appreciated that, although specific embodiments have been described herein for purposes of illustration, various modifications may be made without deviating from the scope of the disclosure. Thus, the described embodiments are to be considered in all respects only as illustrative and not restrictive. In addition, all changes that come within the meaning and range of equivalency of the claims are to be embraced within their scope.

What is claimed is:

1. An electronic assembly, comprising:
   a printed circuit board including a plurality of stacked layers having opposing outer edges, wherein the stacked layers comprise:
   a plurality of conductive layers;
   a plurality of dielectric layers respectively interposed between the conductive layers; and
   one or more phase change material layers interposed between at least one pair of the dielectric layers or at least one pair of the conductive layers;
   wherein the one or more phase change material layers are each a continuous layer that extends between the opposing outer edges of the stacked layers;
   wherein during a phase change, the one or more phase change material layers are configured to absorb thermal energy at a phase transition temperature to provide enhanced cooling of the printed circuit board.

2. The electronic assembly of claim 1, wherein the stacked layers of the printed circuit board comprise:
   a first dielectric layer;
   a phase change material layer under the first dielectric layer; and
   a second dielectric layer under the phase change material layer.

3. The electronic assembly of claim 1, wherein the stacked layers of the printed circuit board comprise:
   a first conductive layer;
   a phase change material layer under the first conductive layer; and
   a second conductive layer under the phase change material layer.

4. The electronic assembly of claim 1, wherein the one or more phase change material layers comprise a paraffin wax, dimethyl terephthalate, D-mannitol, adipic acid, potassium thiocyanate, hydroquinone, or benzanilide.

5. The electronic assembly of claim 1, wherein the one or more phase change material layers have edges that are sealed in a fluid-tight manner.

6. The electronic assembly of claim 1, further comprising at least one electronic device electrically coupled to the printed circuit board.

7. An electronic assembly, comprising:
   a metal core printed circuit board including a plurality of stacked layers having opposing outer edges, wherein the stacked layers comprise:
   a metal core base layer;
   a plurality of dielectric layers over the metal core base layer;
   a plurality of conductive layers respectively interposed between the dielectric layers; and
   one or more phase change material layers interposed between at least one pair of the dielectric layers or at least one pair of the conductive layers;
   wherein the one or more phase change material layers are each a continuous layer that extends between the opposing outer edges of the stacked layers;
   wherein during a phase change, the phase change material layer is configured to absorb thermal energy at a phase transition temperature to provide enhanced cooling of the metal core printed circuit board.

8. The electronic assembly of claim 7, wherein the stacked layers of the metal core printed circuit board comprise:
   a first dielectric layer;
   a phase change material layer under the first dielectric layer; and a second dielectric layer under the phase change material layer.

9. The electronic assembly of claim 7, wherein the stacked layers of the metal core printed circuit board comprise:
a first conductive layer;
a phase change material layer under the first conductive layer; and
a second conductive layer under the phase change material layer.

10. The electronic assembly of claim 7, wherein the metal core base comprises aluminum, copper, or alloys thereof.

11. The electronic assembly of claim 7, wherein the one or more phase change material layers comprise dimethyl terephthalate, D-mannitol, adipic acid, potassium thiocyanate, hydroquinone, or benzanilide.

12. The electronic assembly of claim 7, wherein the one or more phase change material layers have edges that are sealed in a fluid-tight manner with an adhesive or a polymer.

13. The electronic assembly of claim 7, further comprising at least one electronic device mounted on an outer surface of and electrically coupled to the printed circuit board.

14. The electronic assembly of claim 7, wherein the metal core base layer extends continuously between the opposing outer edges of the stacked layers.

15. An electronic assembly, comprising:
a printed circuit board including a plurality of stacked layers having opposing outer edges, wherein the stacked layers comprise:
a plurality of conductive layers;
a plurality of dielectric layers interposed between the conductive layers; and
a phase change material layer interposed between at least one pair of the dielectric layers or at least one pair of the conductive layers;
wherein the phase change material layer extends continuously between the opposing outer edges of the stacked layers;
wherein at least one cavity is defined by at least one of the conductive layers and at least one of the dielectric layers such that a portion of the phase change material layer is held in the at least one cavity;
at least one electronic device electrically coupled to the printed circuit board, such that the electronic device is in contact with at least one of the conductive layers and also in contact with the portion of the phase change material layer in the at least one cavity;
wherein during a phase change, the phase change material layer is configured to absorb thermal energy at a phase transition temperature to provide enhanced cooling of the printed circuit board.

16. The electronic assembly of claim 15, wherein the stacked layers of the printed circuit board comprise:
a first dielectric layer;
the phase change material layer under the first dielectric layer; and
a second dielectric layer under the phase change material layer.

17. The electronic assembly of claim 15, wherein the stacked layers of the printed circuit board comprise:
a first conductive layer;
the phase change material layer under the first conductive layer; and
a second conductive layer under the phase change material layer.

18. The electronic assembly of claim 15, wherein the phase change material layer comprises dimethyl terephthalate, D-mannitol, adipic acid, potassium thiocyanate, hydroquinone, or benzanilide.

19. The electronic assembly of claim 15, wherein the phase change material layer has edges that are sealed in a fluid-tight manner with an adhesive or a polymer.

20. The electronic assembly of claim 15, wherein the printed circuit board comprises a metal core printed circuit board.

* * * * *